US012707981B2

(12) United States Patent
Jung et al.

(10) Patent No.: US 12,707,981 B2
(45) Date of Patent: Aug. 11, 2026

(54) SEMICONDUCTOR DEVICE AND METHOD OF FORMING SHIELDING MATERIAL CONTAINING CONDUCTIVE SPHERES

(71) Applicant: STATS ChipPAC Pte. Ltd., Singapore (SG)

(72) Inventors: JinHee Jung, Incheon (KR); ChangOh Kim, Incheon (KR)

(73) Assignee: STATS ChipPAC Pte. Ltd., Singapore (SG)

(*) Notice: Subject to any disclaimer, the term of this patent is extended or adjusted under 35 U.S.C. 154(b) by 426 days.

(21) Appl. No.: 18/314,571

(22) Filed: May 9, 2023

(65) Prior Publication Data

US 2024/0379580 A1 Nov. 14, 2024

(51) Int. Cl.

*H10W 42/20* (2026.01)
*H10W 74/01* (2026.01)
*H10W 74/10* (2026.01)
*H10W 90/00* (2026.01)

(52) U.S. Cl.

CPC ........... *H10W 42/20* (2026.01); *H10W 74/01* (2026.01); *H10W 74/114* (2026.01); *H10W 90/724* (2026.01)

(58) Field of Classification Search

None
See application file for complete search history.

(56) References Cited

U.S. PATENT DOCUMENTS

| | | | | |
|---|---|---|---|---|
| 5,998,867 | A * | 12/1999 | Jensen | H10W 74/121 257/659 |
| 7,608,326 | B2 * | 10/2009 | Johnson | H05K 7/20481 428/328 |
| 8,325,079 | B2 * | 12/2012 | Shah | H01B 1/24 342/4 |
| 9,685,413 | B1 * | 6/2017 | Prakash | H10W 42/20 |
| 9,836,095 | B1 * | 12/2017 | Lim | G06F 1/182 |
| 9,960,387 | B2 * | 5/2018 | Choi | H10K 50/805 |
| 10,177,096 | B2 * | 1/2019 | Min | H10W 42/20 |
| 11,011,473 | B2 * | 5/2021 | Kang | H10W 42/20 |

(Continued)

FOREIGN PATENT DOCUMENTS

CN 111625149 A 9/2020

*Primary Examiner* — Dale E Page
*Assistant Examiner* — Rohit Parthasarathy
(74) *Attorney, Agent, or Firm* — Robert D. Atkins; PATENT LAW GROUP: Atkins and Associates, P.C.

(57) ABSTRACT

A semiconductor device has a substrate and an electrical component disposed over the substrate. An encapsulant is deposited over the electrical component and substrate. A shielding material, containing a plurality of spheres embedded in a matrix, is formed on the encapsulant. The shielding material 144 can be formed by spray coating, printing, liquid flow, or droplets. The spheres can have a curved or angled shape, e.g., circular, oval, or many flat or curved surfaces joining as a globe. The spheres each have a shell formed over a core. The shell can be a conductive material, while the core is an insulating material. Alternatively, the shell can be an insulating material, while the core is a conductive material. The shielding material scatters electromagnetic interference noise waves by reflection off the shell of the spheres. The shielding material can absorb electromagnetic interference noise waves into the core of the spheres.

24 Claims, 10 Drawing Sheets

(56) References Cited

U.S. PATENT DOCUMENTS 11,770,920 B2 * 9/2023 Li ........................ H05K 9/0088 361/818
11,804,420 B2 * 10/2023 Marin ................... H10W 70/22
12,030,226 B1 * 7/2024 Mott .................... H05K 9/0083
12,035,516 B2 * 7/2024 Nam .................... H05K 9/0081
2004/0217472 A1 * 11/2004 Aisenbrey ............ H01Q 1/2283 257/734
2005/0077596 A1 * 4/2005 Bauer ................... H10W 42/20 257/559
2007/0041072 A1 * 2/2007 Yen ...................... H05K 9/0088 359/244
2008/0061406 A1 * 3/2008 Joh ....................... H10W 42/20 257/E23.114
2010/0059243 A1 * 3/2010 Chang .................... H05K 9/009 174/36
2013/0082368 A1 * 4/2013 Kim ...................... H10W 42/20 257/659
2014/0168902 A1 * 6/2014 Park ...................... H10W 40/22 361/767
2014/0264191 A1 * 9/2014 Rantala ................. H10F 77/211 427/58
2015/0076670 A1 * 3/2015 Pan ....................... H10W 42/20 257/659
2018/0346679 A1 * 12/2018 Shishkin .................. H01B 1/24
2019/0139902 A1 * 5/2019 Lee ..................... H10W 40/251
2021/0392798 A1 * 12/2021 Suemori ................ H05K 5/065
2022/0030751 A1 * 1/2022 Umeda .................. H05K 9/003
2022/0225550 A1 * 7/2022 Nam .................... H05K 9/0081
2024/0128200 A1 * 4/2024 Shin ...................... H10W 42/20
2024/0321768 A1 * 9/2024 Shin ...................... H10W 42/20
2024/0379580 A1 * 11/2024 Jung ..................... H10W 42/20
2024/0413095 A1 * 12/2024 Shin ...................... H10W 42/20

* cited by examiner 120
122
124
126
128

130a
130b
130c
130d
130e
130f
112
114
134
136

141
130f
146
112
114
124
122
128
130e
126
130d
134
130c
130b
130a
136
140
120

142
143

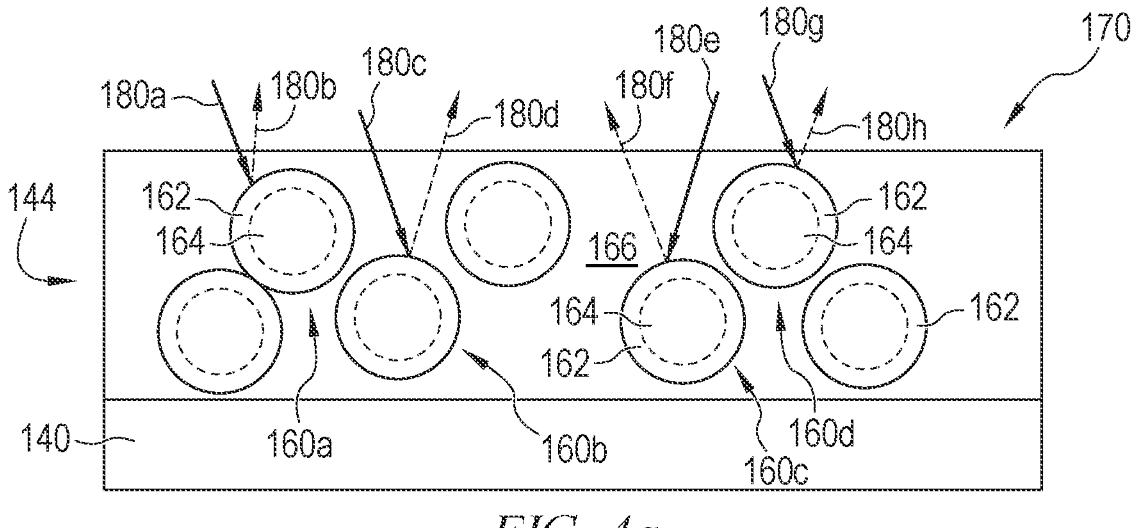
FIG. 4a
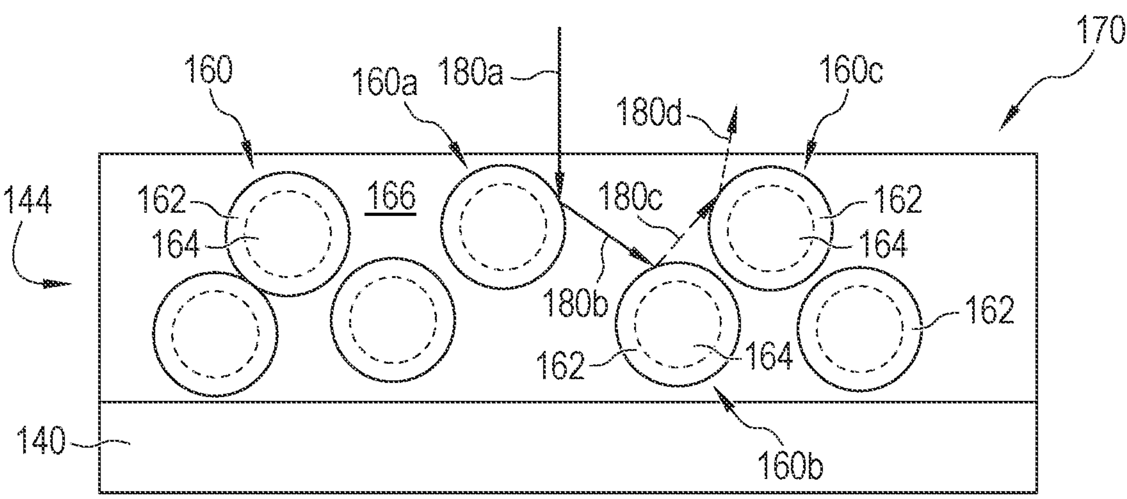
FIG. 4b
170
160
160
180a
180d
144
162
166
180c
162
164
164
180b
162
164
162
140
FIG. 4c

SEMICONDUCTOR DEVICE AND METHOD OF FORMING SHIELDING MATERIAL CONTAINING CONDUCTIVE SPHERES

FIELD OF THE INVENTION

The present invention relates in general to semiconductor devices and, more particularly, to a semiconductor device and method of forming shielding material containing conductive spheres with insulating cores embedded in a matrix.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into an SiP module for higher density in a small space and extended electrical functionality. Within the SIP module, semiconductor die and IPDs are disposed on a substrate for structural support and electrical interconnect. An encapsulant is deposited over the semiconductor die, IPDs, and substrate.

The SIP module includes high speed digital and RF electrical components, highly integrated for small size and low height, and operating at high clock frequencies and high power rating. An electromagnetic shielding material is commonly conformally applied over the encapsulant. The electromagnetic shielding material reduces or inhibits electromagnetic interference (EMI), radio frequency interference (RFI), EMI noise waves, and other inter-device interference, for example as radiated by high-speed digital devices, from affecting neighboring devices within or adjacent to SiP module.

The shielding material can be made with copper (Cu) as a cost-effective material with reasonable electrical conductivity. Unfortunately, Cu shielding is subject to oxidation in the atmosphere. Conventional EMI shielding is commonly formed by metal deposition, such as a sputtering process. It has low throughput and high cost to set working environment.

BRIEF DESCRIPTION OF THE DRAWINGS

FIGS. 4*a*-4*d* illustrate the scattering of EMI noise waves by reflection and absorption;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
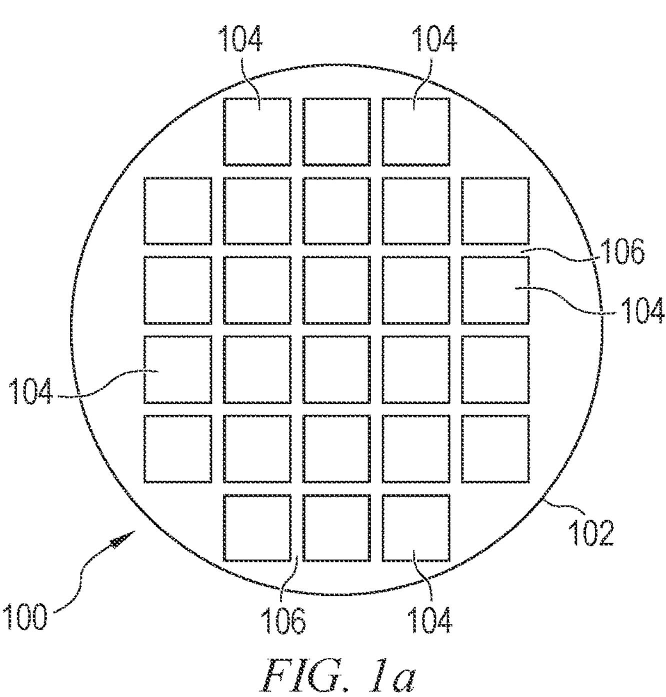
FIGS. 1*a*-1*c* illustrate a semiconductor wafer with a plurality of semiconductor die separated by a saw street.

FIG. 1*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
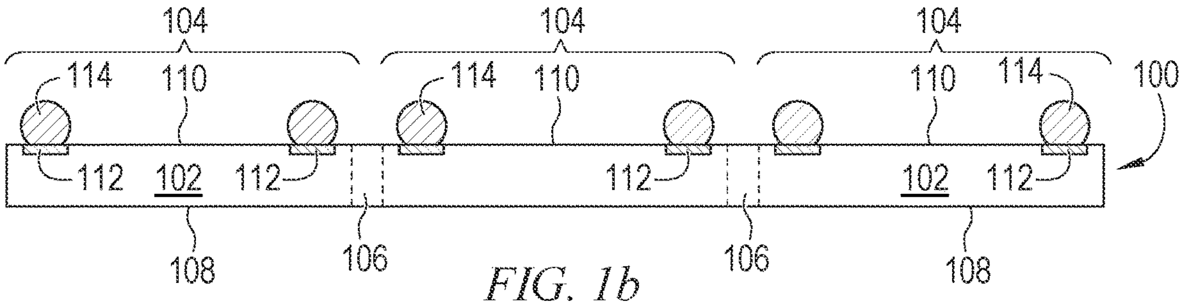

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), Cu, tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
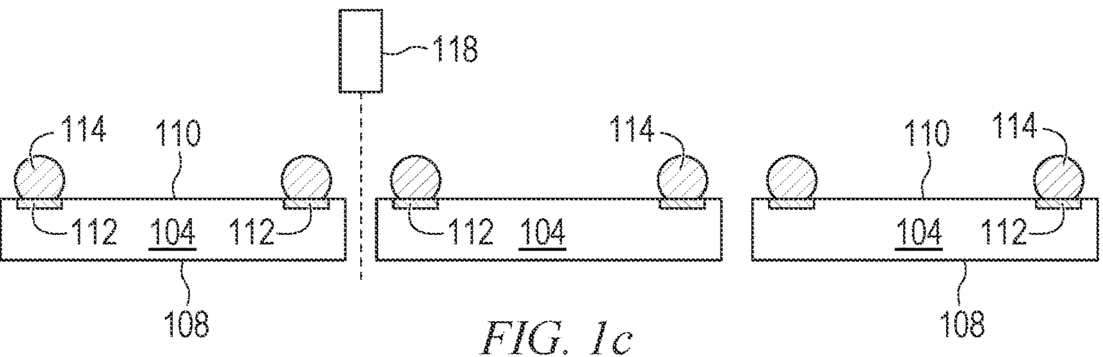

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figures 2A, 2B, 2C:
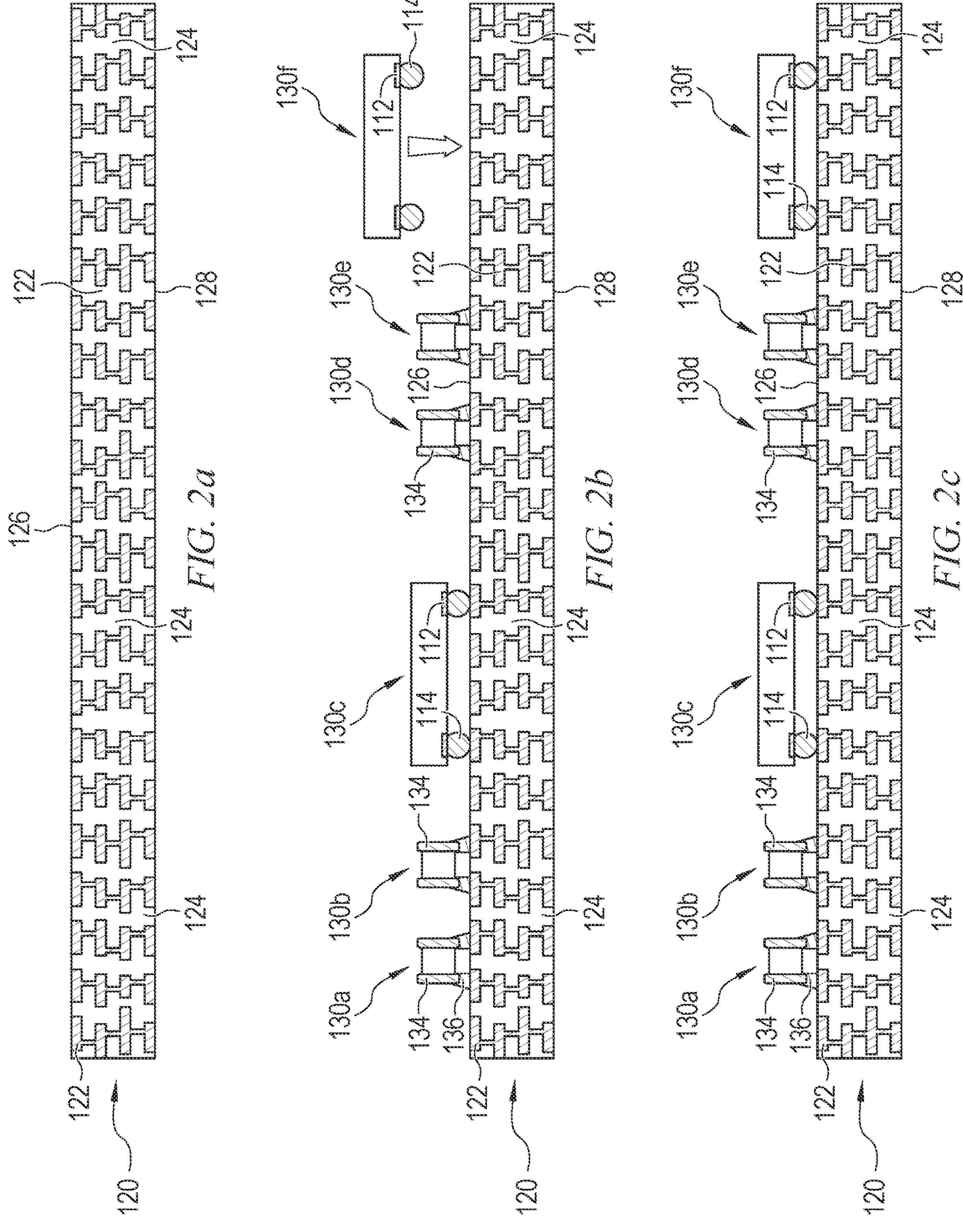
FIGS. 2*a*-2*e* illustrate a process of forming an SiP with electrical components embedded within an encapsulant.

FIGS. 2*a*-2*e* illustrate a process of forming an SiP module with electrical components embedded within an encapsulant. FIG. 2*a* shows a cross-sectional view of multi-layered interconnect substrate 120 including conductive layers 122 and insulating layer 124. Conductive layer 122 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering or thermal oxidation. Insulating layer 124 provides isolation between conductive layers 122.

In FIG. 2*b*, electrical components 130*a*-130*f* are disposed on surface 126 of interconnect substrate 120 and electrically and mechanically connected to conductive layers 122. For example, electrical components 130*a*, 130*b*, 130*d*, and 130*e* can be discrete electrical devices, or IPDs, such as a diode, transistor, resistor, capacitor, and inductor. Electrical components 130*c* and 130*f* can be similar to, or made similar to, semiconductor die 104 from FIG. 1*c* with bumps 114 oriented toward surface 126 of substrate 120. Alternatively, electrical components 130*a*-130*f* can include other semiconductor die, semiconductor packages, surface mount devices, RF components, discrete electrical devices, or integrated passive devices (IPD).

Electrical components 130*a*-130*f* are positioned over substrate 120 using a pick and place operation. Electrical components 130*a*-130*f* are brought into contact with conductive layer 122 on surface 126 of substrate 120. Terminals 134 of electrical components 130*a*, 130*b*, 130*d*, and 130*e* are electrically and mechanically connected to conductive layer 122 using solder or conductive paste 136. Electrical components 130*c* and 130*f* are electrically and mechanically connected to conductive layer 122 by reflowing bumps 114. FIG. 2*c* illustrates electrical components 130*a*-130*f* electrically and mechanically connected to conductive layers 122 of substrate 120.

Figures 2D, 2E:
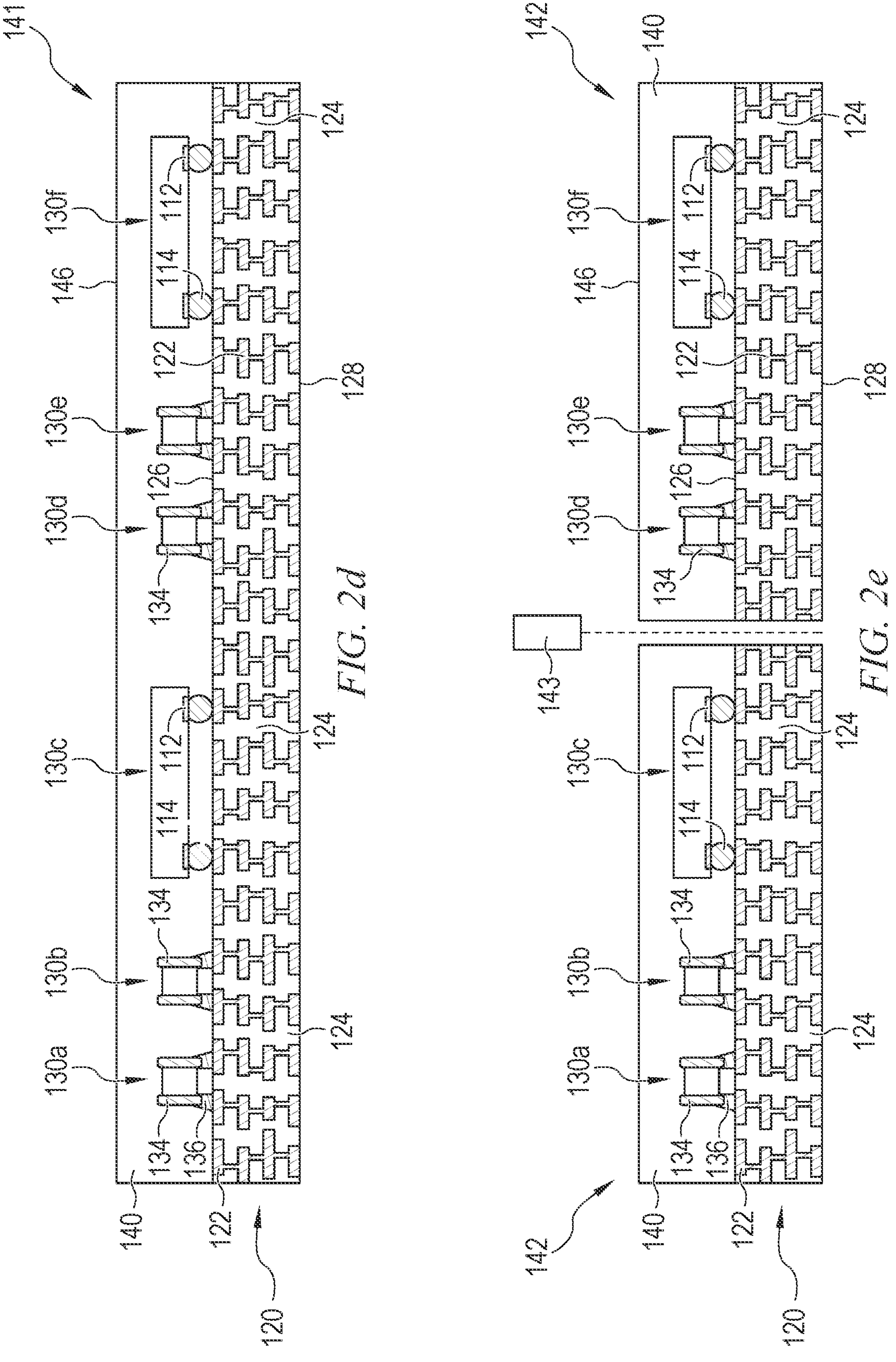

In FIG. 2*d*, encapsulant or molding compound 140 is deposited over and around electrical components 130*a*-130*f* and substrate 120 using a paste printing, compressive molding, transfer molding, liquid encapsulant molding, vacuum lamination, spin coating, or other suitable applicator. Encapsulant 140 can be liquid or granular polymer composite material, such as epoxy resin with filler, epoxy acrylate with filler, or polymer with proper filler. Encapsulant 140 is non-conductive, provides structural support, and environmentally protects the semiconductor device from external elements and contaminants.

Substrate 120, electrical components 130*a*-130*f*, and encapsulant 140 constitute reconstituted wafer or panel 141. In FIG. 2*e*, reconstituted wafer or panel 141 is singulated using saw blade or laser cutting tool 143 into individual semiconductor packages 142.

Figure 3A:
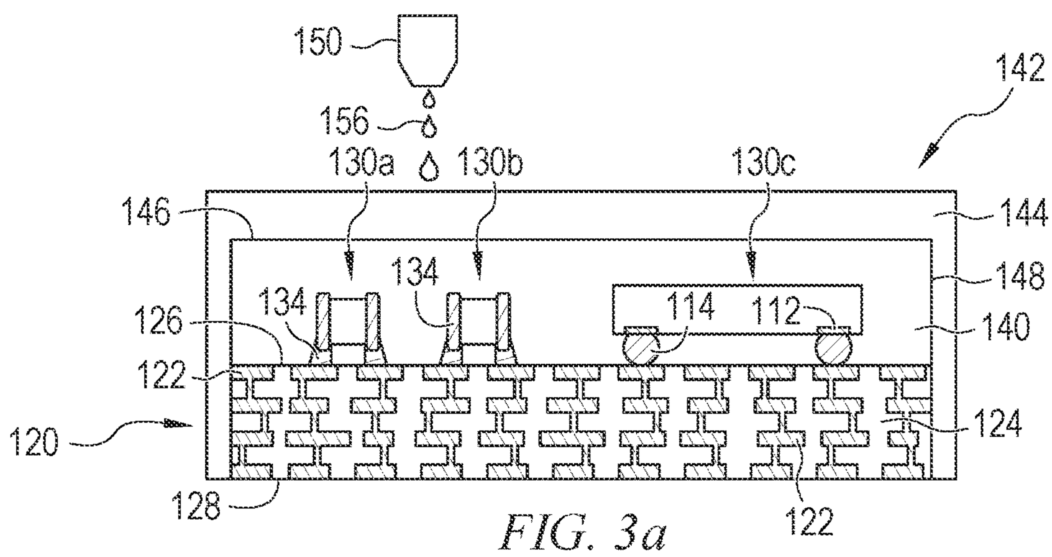
FIGS. 3*a*-3*e* illustrate a process of forming shielding material over the SiP to scatter EMI noise waves.

FIG. 3*a* illustrates semiconductor package 142 post singulation. Electrical components 130*a*-130*f* may contain IPDs that are susceptible to or generate EMI, RFI, harmonic distortion, EMI noise waves, and inter-device interference. For example, the IPDs contained within electrical components 130*a*-130*f* provide the electrical characteristics needed for high-frequency applications, such as resonators, high-pass filters, low-pass filters, band-pass filters, symmetric Hi-Q resonant transformers, and tuning capacitors. In another embodiment, electrical components 130*a*-130*f* contain digital circuits switching at a high frequency, which could interfere with the operation of other IPDs.

To address EMI, RFI, harmonic distortion, EMI noise waves, and inter-device interference, shielding material 144 is deposited, sprayed, printed, or otherwise formed on surface 146 of encapsulant 140. Shielding material 144 extends down side surfaces 148 and contacts conductive layer 122. In one embodiment, shielding material 144 is deposited onto surface 146 using dispenser 150 to release material as a spray coating or liquid flow or droplet 156.

Figure 3B:
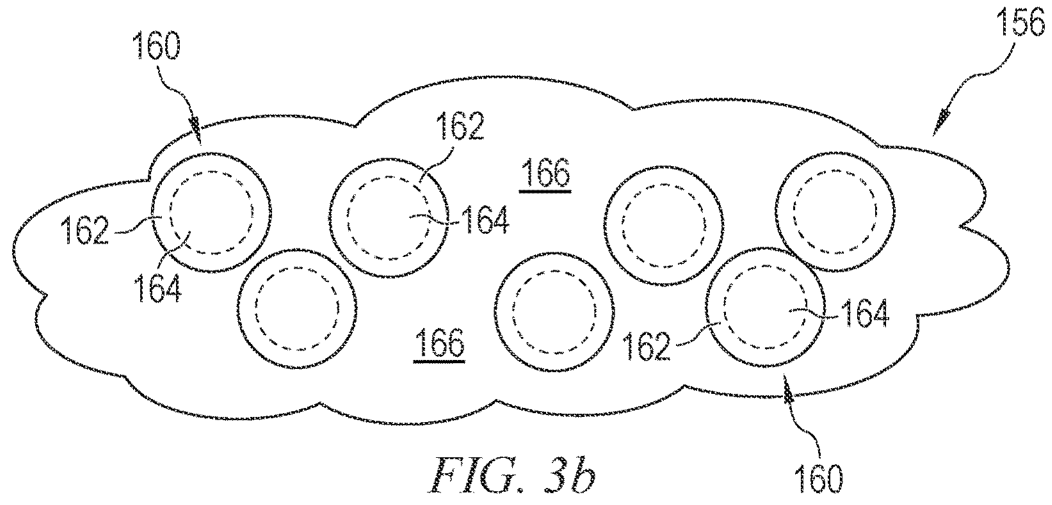

FIG. 3*b* shows further detail of shielding material 144 containing electrically conductive spheres 160 embedded within matrix 166. Matrix 166 can be conductive ink. Matrix 166 can also be an epoxy, thermal grease, such as silicon, or polymer type, such as polymethyl methacrylate (PMMA) or polyethylene terephthalate (PET). Each electrically conductive sphere 160 is made with an electrically conductive shell 162 covering an inner insulating or dielectric material 164. Conductive shell 162 can be one or more layers of Al, Cu, Sn, Ni, Au, Ag, or other suitable electrically conductive material. Conductive shell 162 can also be one or more layers of iron, cobalt, or other suitable magnetic material. Insulating material 164 can be one or more layers of SiO2, Si3N4, SiON, Ta2O5, Al2O3, solder resist, polyimide, BCB, PBO, and other material having similar insulating and structural properties. Alternatively, insulating material 164 can be Ajinomoto build-up film (ABF) or polytetrafluoroethylene (PTFE) pre-impregnated (prepreg or PPG). Insulating material 164 can be a gas, such as nitrogen or atmosphere. Insulating material 164 can be woven glass, matte glass, FR-4, FR-1, CEM-1, or CEM-3 with a combination of phenolic cotton paper, epoxy, resin, polyester, and other reinforcement fibers or fabrics. Insulating material 164 can be formed using PVD or CVD. Conductive shell 162 can be formed by PVD, CVD, electrolytic plating, electroless plating process, or other suitable metal deposition process. The conductive shell 162 of some spheres 160 may contact the conductive shell of an adjacent sphere. Other conductive spheres 160 can be physically isolated within matrix 166.

Figure 3C:
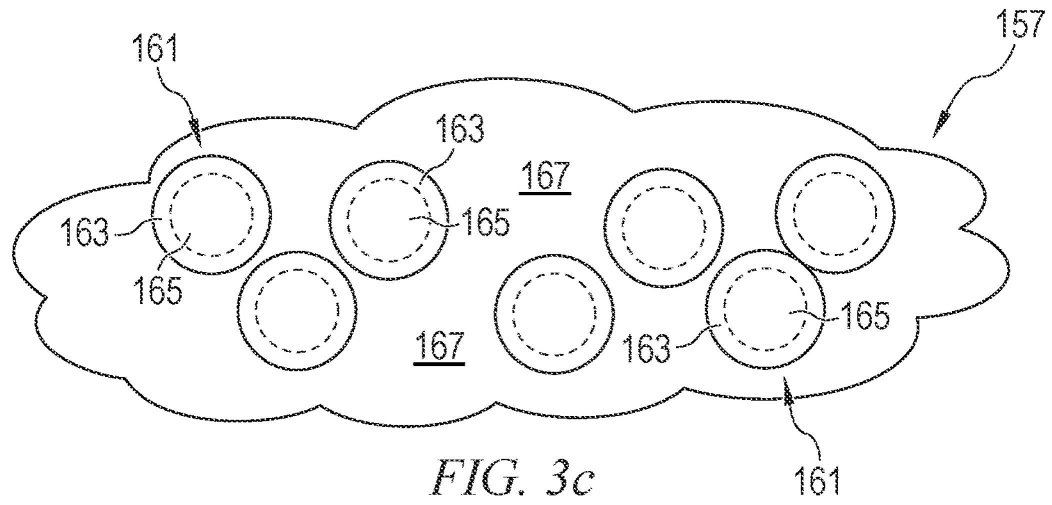

FIG. 3*c* illustrates another embodiment of shielding material 144 containing spheres 161 embedded within matrix 167 deposited onto surface 146 using dispenser 150 to release material as a spray coating or liquid flow or droplet 157. Matrix 167 can be conductive ink. Matrix 167 can also be an epoxy, thermal grease, such as silicon, or polymer type, such as PMMA or PET. Each sphere 161 is made with an outer insulating or dielectric shell 163 covering an inner electrically conductive material 165. Insulating shell 163 can be one or more layers of SiO2, Si3N4, SiON, Ta2O5, Al2O3, solder resist, polyimide, BCB, PBO, and other material having similar insulating and structural properties. Alternatively, insulating shell 163 can be ABF or PTFE. Insulating shell 163 can be woven glass, matte glass, FR-4, FR-1, CEM-1, or CEM-3 with a combination of phenolic cotton paper, epoxy, resin, polyester, and other reinforcement fibers or fabrics. Insulating shell 163 can be formed using PVD or CVD. Inner conductive material 165 can be one or more layers of Al, Cu, Sn, Ni, Au, Ag, or other suitable electrically conductive material. Inner conductive material 165 can also be one or more layers of iron, cobalt, or other suitable magnetic material. Inner conductive material 165 can be formed by PVD, CVD, electrolytic plating, electroless plating process, or other suitable metal deposition process. The shell 163 of some spheres 161 may contact the shell of an adjacent sphere. Other spheres 161 can be physically isolated within matrix 167. The comments regarding spheres 160 embedded within matrix 166 also apply to spheres 161 embedded within matrix 167.

Figure 3D:
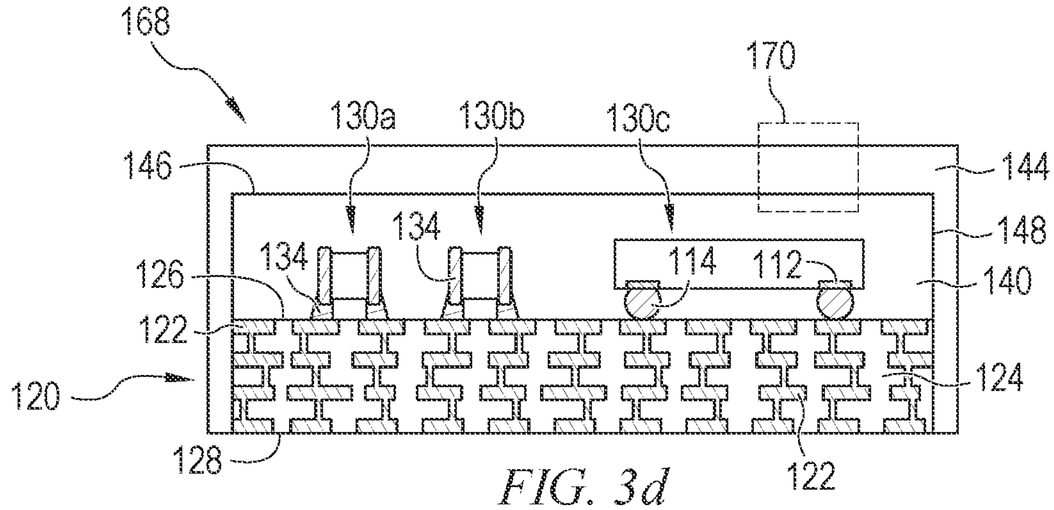
Figure 3E:
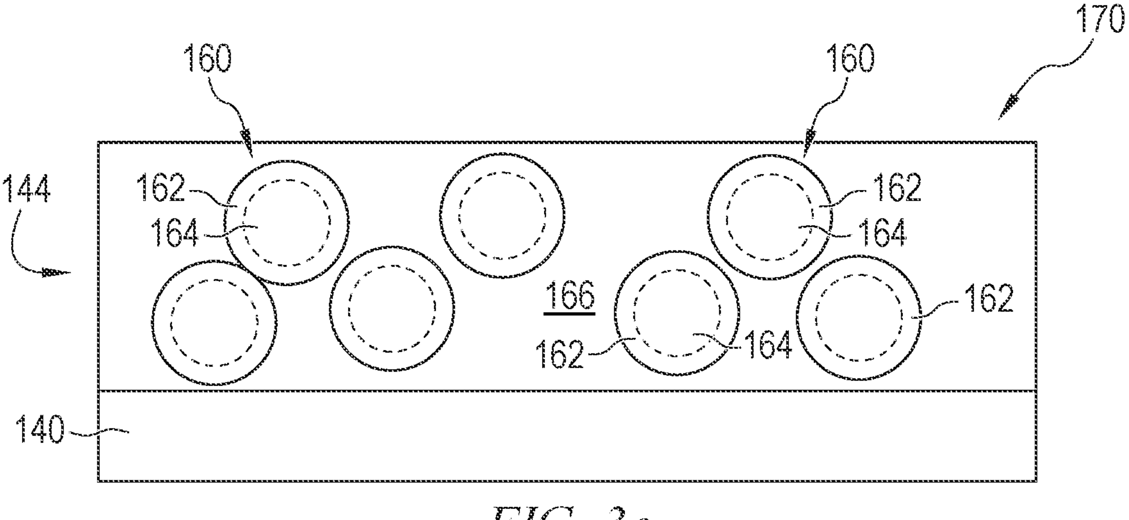

The combination of substrate 120, electrical components 130*a*-130*f*, encapsulant 140, and shielding material 144 constitutes system-in-package (SiP) 168, as in FIG. 3*d*. FIG. 3*e* shows further detail of region or box 170 from FIG. 3*d*. Matrix 166 is deposited over encapsulant 140. Matrix 166 includes a plurality of electrically conductive spheres 160 embedded within the matrix. Alternatively, matrix 167 includes a plurality of spheres 161 embedded within the matrix. The shell of some spheres may contact the shell of an adjacent sphere. Other spheres can be physically isolated within matrix 166.

As shown in FIG. 4*a*, conductive spheres 160 embedded within matrix 166 are useful in reflecting or scattering EMI noise waves 180. For example, EMI noise wave 180*a* incident to conductive shell 162 of sphere 160*a* is reflected away from the sphere as EMI noise wave 180*b* and is attributed to reflection loss. The reflected angle depends on the angle of incidence and the shape of conductive sphere 160. In a similar manner, EMI noise wave 180*c* incident to conductive shell 162 of sphere 160*b* is reflected away from the sphere as EMI noise wave 180*d*. EMI noise wave 180*e* incident to conductive shell 162 of sphere 160*c* is reflected away from the sphere as EMI noise wave 180*f*. EMI noise wave 180*g* incident to conductive shell 162 of sphere 160*d* is reflected away from the sphere as EMI noise wave 180*h*. All conductive spheres 160 embedded with matrix 166 are capable of reflecting EMI noise waves 180. Conductive layer 162 can be roughed to increase the reflection or scattering effect. Accordingly, a majority of the energy in noise waves 180*a*, 180*c*, 180*e*, and 180*g* is reflected, scattered, dissipated, deflected, or otherwise blocked from reaching electrical components 130*a*-130*c* within SiP 168.

In some cases, the EMI noise wave 180 will reflect off multiple conductive spheres 160, as shown in FIG. 4*b*. For example, EMI noise wave 180*a* incident to conductive shell 162 of sphere 160*a* is reflected away from the sphere as EMI noise wave 180*b* and is attributed to reflection loss. The angle of reflection of EMI noise wave 180*b* is such that the EMI noise wave is incident to conductive shell 162 of sphere 160*b*. The EMI noise wave 180*b* is reflected away from conductive sphere 160*b* as EMI noise wave 180*c*. The angle of reflection of EMI noise wave 180*c* is such that the EMI noise wave is incident to conductive shell 162 of sphere 160*c*. The EMI noise wave 180*c* is reflected away from conductive sphere 160*c* as EMI noise wave 180*d*. The angle of reflection of EMI noise wave 180*d* is such that the EMI noise wave is directed away from SiP 168. Accordingly, a majority of the energy in EMI noise waves 180*a*, 180*b*, 180*c*, and 180*d* is reflected, scattered, dissipated, deflected, or otherwise blocked from reaching electrical components 130*a*-130*c* within SiP 168.

In another case, some components of the EMI noise wave 180 may reflect within one or more conductive spheres 160, as shown in FIG. 4*c*. For example, a portion of EMI noise wave 180*a* incident to conductive shell 162 of sphere 160 may pass through the conductive shell and be reflected off a first portion of the interior surface of the conductive shell as EMI noise wave 180*b*. The angle of reflection of EMI noise wave 180*b* off the first portion of the interior surface of conductive shell 162 is such that the EMI noise wave is incident to a second portion of the interior surface of conductive shell 162. The EMI noise wave 180*b* is reflected away from the second portion of the interior surface of conductive shell 162 as EMI noise wave 180*c*. The angle of reflection of EMI noise wave 180*c* off the second portion of the interior surface of conductive shell 162 is such that the EMI noise wave is incident to a third portion of the interior surface of conductive shell 162. The EMI noise wave 180*c* is reflected away from the second portion of the interior surface of conductive shell 162 as EMI noise wave 180*d*. The reflections continue until EMI noise wave dissipates and is absorbed within conductive shell 160 and insulating core 164, or otherwise escapes the shell. In any case, a majority of the energy in EMI noise waves 180*a*-180*d* is reflected, scattered, dissipated, deflected, or otherwise blocked from reaching electrical components 130*a*-130*c* within SiP 168.

Figure 4D:
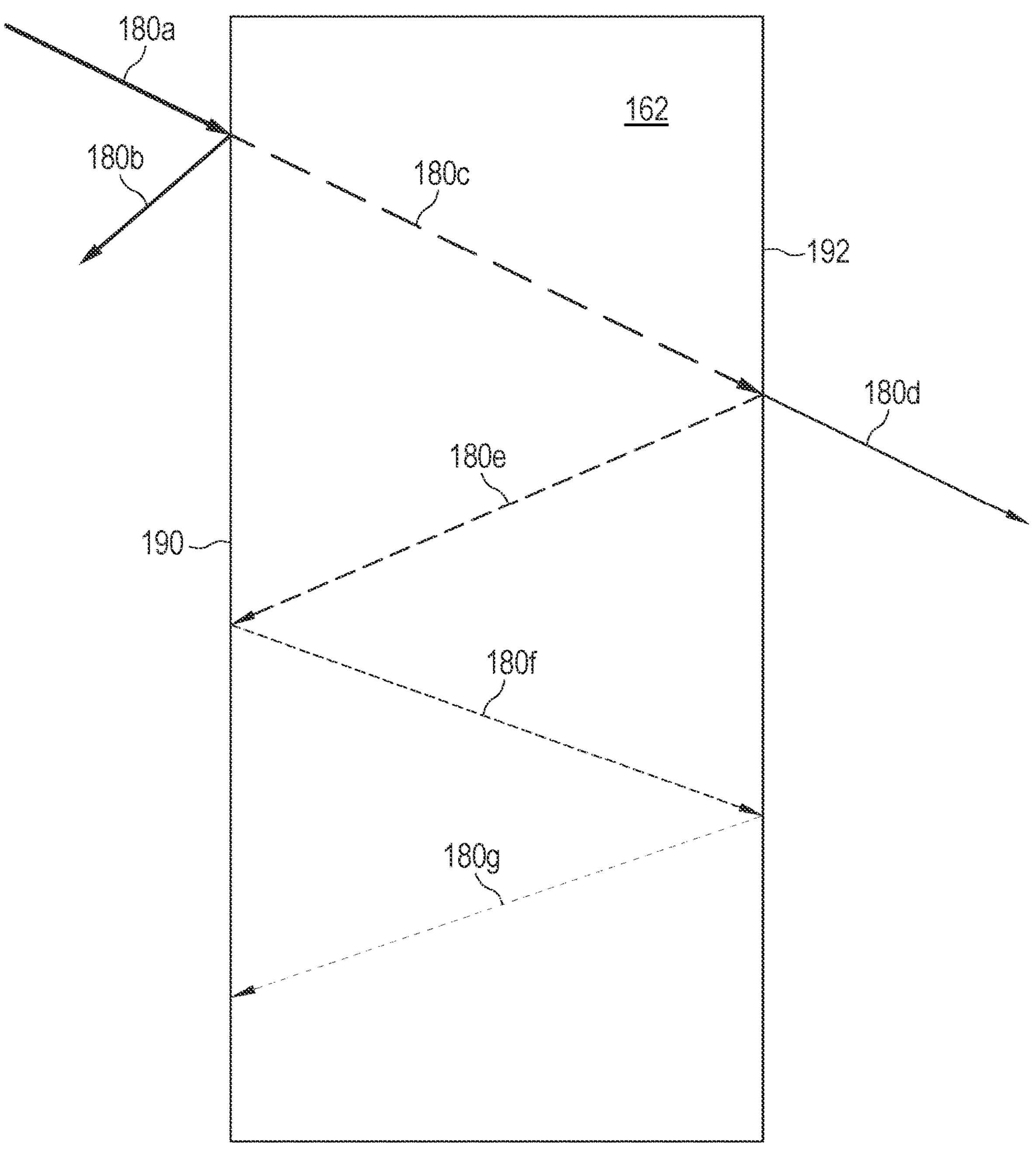

In another case, EMI noise wave 180*a* incident to outer surface 190 of conductive shell 162 is reflected away from the sphere as EMI noise wave 180*b* and is attributed to reflection loss, as shown in FIG. 4*d*. The reflected angle depends on the angle of incidence and the shape of conductive sphere 160. Some components of the EMI noise wave 180 may be absorbed into conductive shell 162. For example, a portion of EMI noise wave 180*a* incident to outer surface 190 of conductive shell 162 may pass outer surface 190 of conductive shell 162 as EMI noise wave 180*c*. Upon reaching inner surface 192 of conductive shell 162, a portion of the incident EMI noise wave may continue as EMI noise wave 180*d*. Another portion of EMI noise wave 180*c* incident to inner surface 192 is reflected back as EMI noise wave 180*e*. Upon reaching outer surface 190, a portion of EMI noise wave 180*e* may continue, similar to EMI noise wave 180*d*, or be reflected back as EMI noise wave 180*f*. Upon reaching inner surface 192, a portion of EMI noise wave 180*e* may continue, similar to EMI noise wave 180*d*, or be reflected back as EMI noise wave 180*g*.

FIGS. 4*a*-4*d* have demonstrated that the EMI noise wave 180 can be reflected one or more times. The EMI noise wave 180 can be absorbed into conductive sphere 160 or conductive shell 162 or insulating material 164 and its energy dissipated. In any case, a majority of the energy in EMI noise wave 180 is reflected, scattered, dissipated, deflected, or otherwise blocked from reaching electrical components 130*a*-130*c* within SiP 168. The shape of conductive sphere 160 can reduce or minimize the EMI noise wave. For example, conductive sphere 160 can have any curved or angled shape, e.g., circular, oval, or many flat or curved surfaces joining as a globe. Conductive layer 162 can be roughed to increase the reflection or scattering effect. Multiple reflections reduce the strength of the EMI noise wave. Insulating material 164 assists with absorption and reflection of the EMI noise wave. The effectiveness of shielding material 144 is the ratio of incident transverse field to the transmitted transverse field.

Figure 5A:
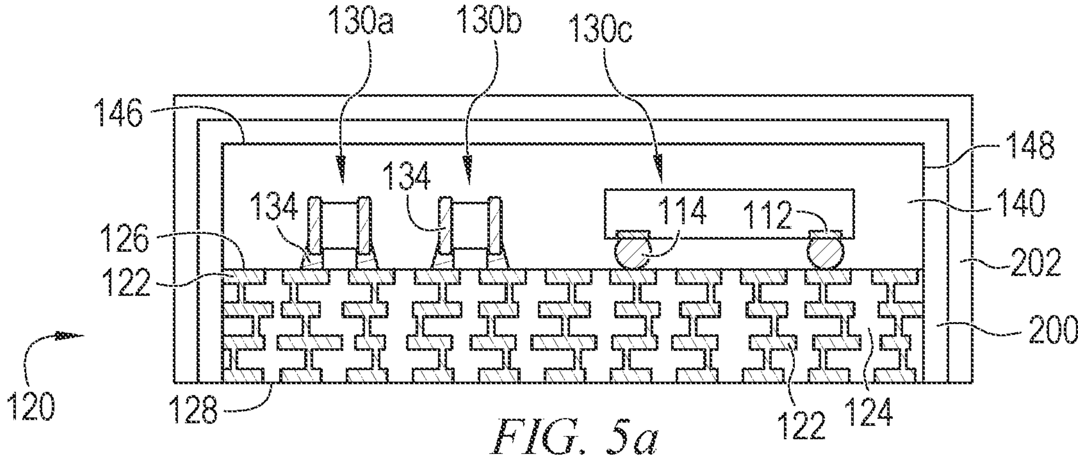
FIGS. 5*a*-5*d* illustrate a process of forming shielding layer as well as shielding material over the SiP.

In another embodiment, continuing from FIG. 2*e*, adhesion layer 200 is deposited over surface 146 and side surfaces 148, as shown in FIG. 5*a*. Adhesion layer 200 can be a thin film of tungsten, niobium, chromium, or titanium. A shielding layer 202 is formed over the adhesion layer 200 to reduce or inhibit the effects of EMI, RFI, and other inter-device interference. Shielding layer 202 can be carbonyl iron, stainless steel, nickel silver, low-carbon steel, silicon-iron steel, foil, conductive resin, carbon-black, aluminum flake, Cu, Sn, Ni, Au, Ag, and other metals and composites capable of dissipating charged particles to ground. Shielding layer 202 is grounded through interconnect substrate 120.

Figure 5B:
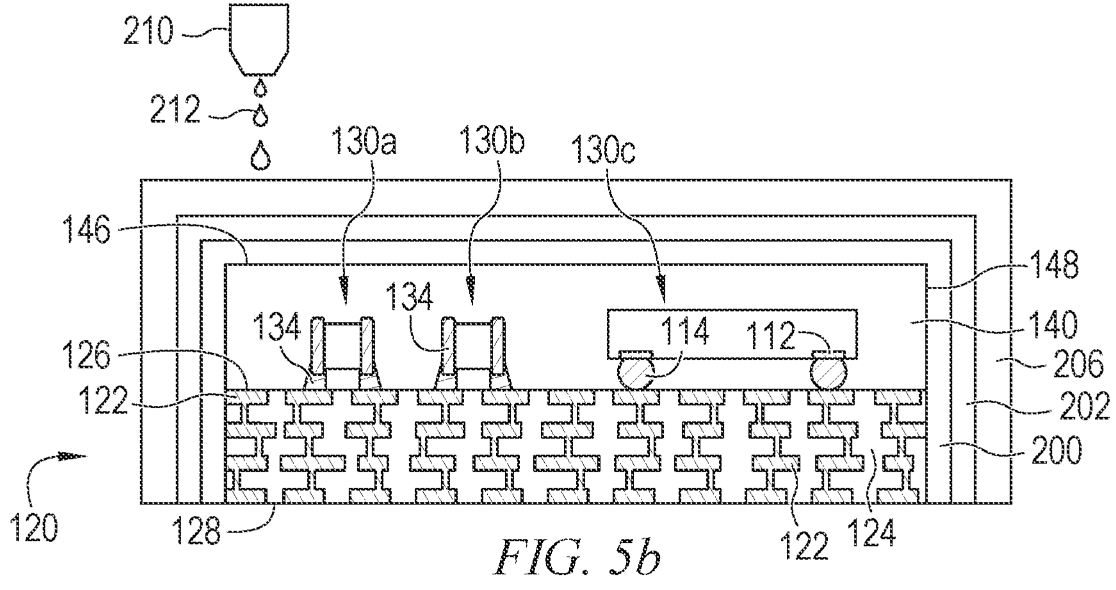

In FIG. 5*b*, shielding material 206 containing electrically conductive spheres 160 embedded within matrix 166, similar to FIG. 3*b*, is deposited over shielding layer 202 using dispenser 210 to release material as a spray coating or liquid flow or droplet 212. Alternatively, shielding material 206 contains spheres embedded in a matrix, similar to FIG. 3*c*.

Figure 5C:
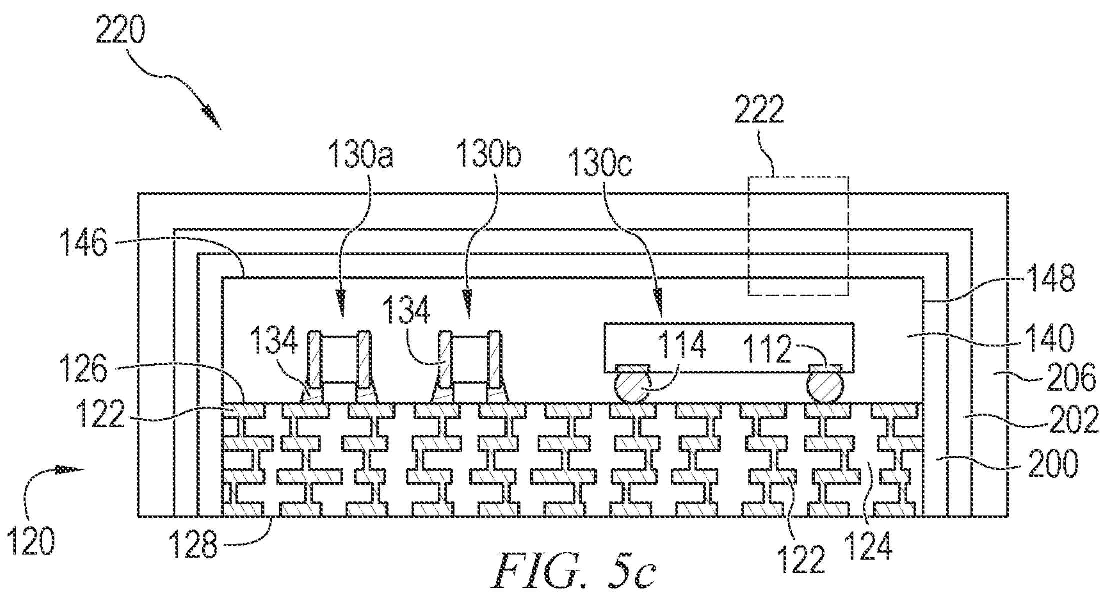
Figure 5D:
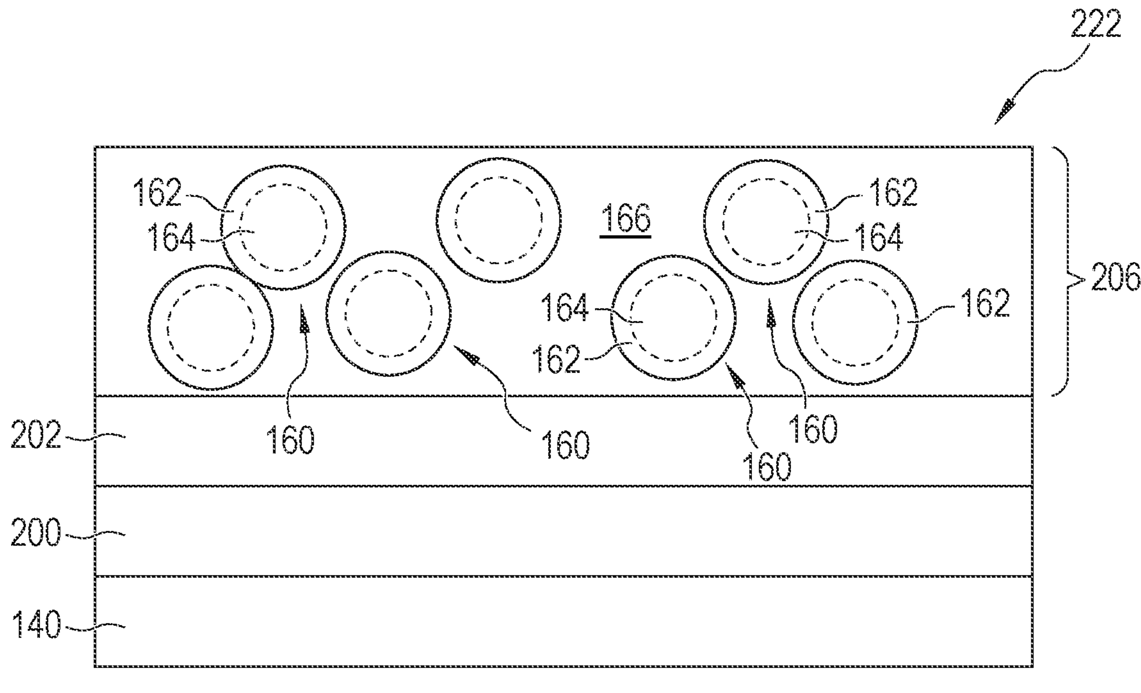

The combination of substrate 120, electrical components 130*a*-130*f*, encapsulant 140, adhesion layer 200, shielding layer 202, and shielding material 206 constitutes SiP 220, as in FIG. 5*c*. FIG. 5*d* shows further detail of region or box 222 from FIG. 5*c*. Matrix 166 is deposited over encapsulant 140. Matrix 166 includes a plurality of electrically conductive spheres 160 embedded within the matrix, similar to FIG. 3*e*. Alternatively, matrix 167 includes a plurality of spheres 161 embedded within the matrix. The shell of some spheres may contact the shell of an adjacent sphere. Other spheres can be physically isolated within matrix 166.

Figure 6:
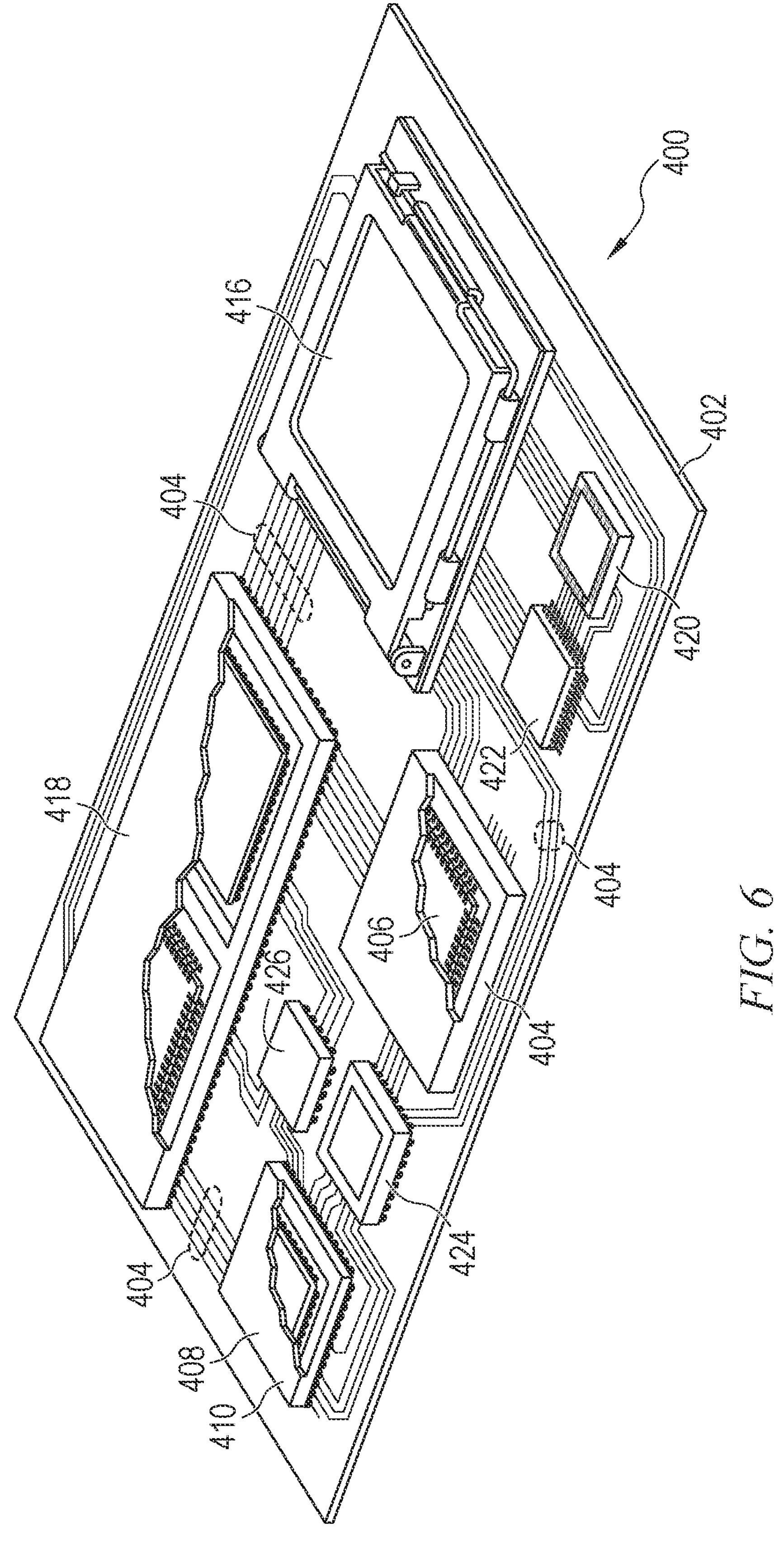
FIG. 6 illustrates a printed circuit board (PCB) with different types of packages disposed on a surface of the PCB.

FIG. 6 illustrates electrical device 400 having a chip carrier substrate or PCB 402 with a plurality of semiconductor packages disposed on a surface of PCB 402, including SiP 168 and 220. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 6, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising: a substrate; an electrical component disposed over the substrate; an encapsulant deposited over the electrical component and substrate; an adhesive layer disposed in contact with the encapsulant; a first shielding layer formed in contact with a surface of the adhesive layer; and a second shielding material including a conductive ink and a plurality of spheres embedded in the conductive ink and deposited as droplets in contact with a surface of the first shielding layer encapsulant as droplets, wherein a first one of the plurality of spheres contacts a second one of the plurality of spheres to dissipate electromagnetic interference and the first shielding layer remains absent the plurality of spheres.

2. The semiconductor device of claim 1, wherein the spheres each include:

a core; and a shell formed over the core, wherein the shell of a first one of the plurality of spheres contacts the shell of a second one of the plurality of spheres to dissipate electro-magnetic interference.

3. The semiconductor device of claim 2, wherein the shell includes a conductive material and the core includes an insulating material.

4. The semiconductor device of claim 2, wherein the shell includes an insulating material and the core includes a conductive material.

5. The semiconductor device of claim 2, wherein the second shielding material scatters electromagnetic interference noise waves by reflection off the shell of the spheres.

6. The semiconductor device of claim 2, wherein the second shielding material absorbs electromagnetic interference noise waves into the core of the spheres.

7. A semiconductor device, comprising:

an electrical component;

an encapsulant deposited over the electrical component;

a first shielding layer formed over the encapsulant; and a second shielding material including a conductive ink and a plurality of spheres, each comprising a core and a shell formed over the core, embedded in the conductive ink and deposited in contact with a surface of the first shielding layer opposite the encapsulant, wherein the shell of a first one of the plurality of spheres contacts the shell of a second one of the plurality of spheres to dissipate electro-magnetic interference, while the first shielding layer remains absent the plurality of spheres.

8. The semiconductor device of claim 7 wherein the shell includes a conductive material and the core includes an insulating material.

9. The semiconductor device of claim 7, wherein the shell includes an insulating material and the core includes a conductive material.

10. The semiconductor device of claim 7, wherein the second shielding material scatters electromagnetic interference noise waves by reflection off the shell of the spheres.

11. The semiconductor device of claim 7, wherein the second shielding material absorbs electromagnetic interference noise waves into the core of the spheres.

12. The semiconductor device of claim 7, further including a substrate, wherein the electrical component is disposed over the substrate.

13. A method of making a semiconductor device, comprising:

providing a substrate;

disposing an electrical component over the substrate;

depositing an encapsulant over the electrical component and substrate;

forming a first shielding layer over the encapsulant; and forming a second shielding material including a conductive ink and a plurality of conductive spheres embedded in the conductive ink and deposited as droplets in contact with a surface of the first shielding layer opposite the encapsulant, wherein a first one of the plurality of spheres contacts a second one of the plurality of spheres to dissipate electro-magnetic interference, while the first one of the spheres and the second one of the spheres are electrically isolated from the substrate and the first shielding layer remains absent the plurality of spheres.

14. The method of claim 13, wherein the spheres each include a shell formed over a core and the shell of a first one of the plurality of spheres contacts the shell of a second one of the plurality of spheres to dissipate electro-magnetic interference.

15. The method of claim 14, wherein the shell includes a conductive material and the core includes an insulating material.

16. The method of claim 14, wherein the shell includes an insulating material and the core includes a conductive material.

17. The method of claim 14, wherein the second shielding material scatters electromagnetic interference noise waves by reflection off the shell of the spheres.

18. The method of claim 14, wherein the second shielding material absorbs electromagnetic interference noise waves into the core of the spheres.

19. A method of making a semiconductor device, comprising:

providing an electrical component;

depositing an encapsulant over the electrical component;

forming a first shielding layer over the encapsulant; and forming a second shielding material including a conductive ink and a plurality of spheres embedded in the conductive ink and deposited in contact with a surface of the first shielding layer opposite the encapsulant, wherein a first one of the plurality of spheres contacts a second one of the plurality of spheres to dissipate electro-magnetic interference, while the first shielding layer remains absent the plurality of spheres.

20. The method of claim 19, wherein the spheres each include a shell formed over a core and the shell of a first one of the plurality of spheres contacts the shell of a second one of the plurality of spheres to dissipate electro-magnetic interference.

21. The method of claim 20, wherein the shell includes a conductive material and the core includes an insulating material.

22. The method of claim 20, wherein the shell includes an insulating material and the core includes a conductive material.

23. The method of claim 20, wherein the second shielding material scatters electromagnetic interference noise waves by reflection off the shell of the spheres.

24. The method of claim 20, wherein the second shielding material absorbs interference noise waves into the core of the conductive spheres.

* * * * *